United States Patent [19]

Liu

[11] Patent Number: 5,567,955

[45] Date of Patent: Oct. 22, 1996

[54] METHOD FOR INFRARED THERMAL IMAGING USING INTEGRATED GASA QUANTUM WELL MID-INFRARED DETECTOR AND NEAR-INFRARED LIGHT EMITTER AND SI CHARGE COUPLED DEVICE

[75] Inventor: Hui C. Liu, Orleans, Canada

[73] Assignee: National Research Council of Canada, Ottawa, Canada

[21] Appl. No.: 434,842

[22] Filed: May 4, 1995

[51] Int. Cl.[6] .................. H01L 29/06; H01L 31/0328; H01L 31/0336; H01L 31/072

[52] U.S. Cl. .................. 257/21; 257/80; 257/225

[58] Field of Search .................. 257/21, 80, 225

[56] References Cited

U.S. PATENT DOCUMENTS

| | | | |
|---|---|---|---|
| 4,367,483 | 1/1983 | Tahashi et al. | 257/80 |
| 4,390,888 | 6/1983 | Risch | 257/225 |
| 5,352,904 | 10/1994 | Wen et al. | 257/21 |
| 5,373,182 | 12/1994 | Norton | 257/440 |

*Primary Examiner*—Stephen D. Meier
*Attorney, Agent, or Firm*—Pascal & Associates

[57] ABSTRACT

A far infrared (FIR) to near infrared (NIR) light converter is comprised of a quantum well intersubband photodetector (QWIP) integrated vertically with a light emitting diode (LED).

13 Claims, 5 Drawing Sheets

METHOD FOR INFRARED THERMAL IMAGING USING INTEGRATED GASA QUANTUM WELL MID-INFRARED DETECTOR AND NEAR-INFRARED LIGHT EMITTER AND SI CHARGE COUPLED DEVICE

FIELD OF THE INVENTION

This invention relates to infrared thermal imaging devices, and in particular to a far-infrared (FIR) to near infrared (NIR) light converter.

BACKGROUND OF THE INVENTION

Infrared thermal imaging detectors are widely used for a variety of applications, such as to provide night vision, surveillance, and for search and rescue. Imaging devices to provide these applications are typically constructed of HgCdTe or InSb focal plane arrays. Such arrays have been difficult to manufacture, and are expensive. Quantum well infrared photodetectors (QWIPs) can detect mid and far infrared light, providing an output current as a result. However, such devices have not been able to be successfully used in efficient and inexpensive arrays to provide a practical imaging detector.

QWIP devices are described in U.S. Pat. No. 4,873,555, issued Oct. 10, 1989 to the University of Pittsburgh and in U.S. Pat. No. 4,894,526 issued Jan. 16, 1990 to American Telephone and Telegraph Company, AT&T Bell Laboratories. The latter patent describes an improved efficiency QWIP device which utilizes a series of quantum wells.

SUMMARY OF THE INVENTION

The present invention integrates vertically a light emitting diode (LED) with a QWIP device. Current from the QWIP device resulting from the impingement of FIR passes through the LED, causing the LED to emit NIR energy. This NIR energy can be efficiently detected by a silicon CCD, resulting in a highly efficient detector. The integrated QWIP and LED are preferably all comprised of a GaAs material system, thus minimizing thermal mismatch problems which could arise if different material systems were used.

In accordance with the present invention, a FIR to NIR energy converter is comprised of a QWIP photodetector integrated vertically with a LED. The integration preferably results from epitaxial deposition of the LED materials over the QWIP materials.

In accordance with another embodiment, the QWIP and LED are disposed on a substrate, the QWIP and LED being divided into an array of sub-QWIPs and sub-LEDs supported by said substrate, and being connected in parallel, the thickness of the substrate being sufficiently transparent so as to allow FIR energy to pass therethrough to the QWIP.

BRIEF INTRODUCTION TO THE DRAWINGS

A better understanding of the invention will be obtained by reading the description of the invention below, with reference to the following drawings, in which:

FIG. 1 is a representative crossection (not to scale) of an embodiment of the invention, FIG. 2 is a representative crossection (not to scale) of another embodiment of the invention, FIG. 3 is a representative crossection (not to scale) of another embodiment of the invention, FIG. 4 is s detailed crossection of an embodiment of the invention, FIG. 5A is a graph of LED output power with output wavelength, FIG. 5B is a graph of responsivity of the QWIP with input wavelength, and FIG. 5C is a graph of LED output power increase with bias current.

DETAILED DESCRIPTION OF THE INVENTION

FIG. 1 illustrates in schematic form the invention in most basic form. A QWIP 1, preferably having a series of quantum wells as described in the aforenoted U.S. Pat. No. 4,894,526, is epitaxially grown on a substrate 3. An LED 5 is epitaxially grown on the QWIP. The substrate 3 is sufficiently thin so as to allow FIR energy to pass through it to the QWIP 1.

It should be noted that the term FIR energy is intended in this specification to include mid infrared energy (MIR) of 3–12 μm wavelength. FIR and MIR thus is used interchangeably in this specification. The NIR wavelength is approximately 800–1000 nm.

Upon application of a bias current, e.g. from a battery 7 via a load resistor 9, to the stacked QWIP and LED in series, the same current passes through both. FIR generates photocurrent in the QWIP device, which passes into the LED. This photocurrent arises from the external bias current, since the QWIP device changes resistance (usually decreases) when infrared light of the appropriate wavelength is shone onto the QWIP. This photocurrent generates or increases NIR emission from the LED, which emission can be detected by a detector that completes the thermal imaging device.

The LED emits light such as NIR when forward biased close to and beyond the flat band condition. Modern III–V epitaxial growth techniques such as GaAs based molecular beam epitaxy can grow both a QWIP device and the LED over the QWIP device on the same wafer, forming a serially connected QWIP-LED device. The external current supply applies forward bias to the series of elements, turning on both the QWIP device and the LED into their operating conditions.

Let $\lambda_{MIR}$ and $\lambda_{NIR}$ be the QWIP device detection wavelength in the mid-infrared region and the LED emission wavelength in the near-infrared region, respectively. Absorption of infrared light at $\lambda_{MIR}$ results in an increase of the current flow in the QWIP device. This increase in current must increase the current through the LED since they are serially connected. Because the LED is biased near or beyond the flat band condition the additional current will give rise to turning on or increasing the LED near-infrared light emission. The mid-infrared light has thus been converted into a near-infrared light, which can be detected by a Si CCD.

The invention can be realized by use of any of a variety of materials systems, for example n- or p-type GaAs-AlGaAs, n-or p-type InGaAs-AlGaAs, n- or p-type InGaAs-InP, and others.

FIG. 2 is a crossection of a QWIP device and LED subdivided into sub-QWIPs 11 and sub-LEDs 13, epitaxially deposited on a substrate 3, forming mesas each of which is comprised of a sub-QWIP and sub-LED.

In this embodiment, a Si CCD 15 formed in a plane is disposed with its detecting surface in close proximity to the sub-LEDs. In operation the energy in FIR wavelengths to be detected passes through the substrate 3 and is detected by each sub-QWIP on which the energy lands (the biasing circuit not being shown in this Figure). The resulting photocurrents pass through the associated sub-LEDs 13, causing them to emit energy of e.g. NIR. This NIR energy is detected by the CCD, and is processed for display in a well known manner.

Due to the close proximity of the CCD to the QWIP-LED array wafer, that wafer acts as a filter, forming a barrier against visible light energy from reaching the CCD.

FIG. 3 is a crossection of another embodiment of the invention. The embodiment is similar to that of FIG. 2, except in this case the CCD is spaced from the emitting surfaces of the sub-LEDs, a lens 17 being interposed between them. The lens focuses the NIR energy from the emitting surfaces of the sub-LEDs 13 on the surface of the CCD 15.

FIG. 4 illustrates in more detail the structure of a successful laboratory prototype of a QWIP device and integrated LED. The layers are, from bottom upward, a bottom contact layer 19 of 800 nm n$^+$-GaAs doped with Si to a density of $1.5 \times 10^{18}$ cm$^-$, a 5 nm GaAs spacer 21, and 50 repeated $Al_{0.25}Ga_{0.75}As$/GaAs quantum wells 23 (such as described in U.S. Pat. No. 4,894,526) with a 40 nm barrier 24 and 5.9 nm well. The wells were doped with a Si-δ-spike to a density of $5 \times 10^{11}$ cm$^{-2}$. These δ-spikes were positioned away from the well center towards the substrate by about 2.5 nm to counter-balance the Si segregation during growth and to ensure the symmetry of the QWIP structure.

Growth continued with the following layers to form the LED: a 40 nm graded $Al_xGa_{1-x}$ layer 25 from x=0.25 to 0.12, a 30 nm GaAs layer 27, a 7.0 nm $In_{0.2}Ga_{0.8}As$ well 28, a 30 nm GaAs layer 29, a 40 nm graded $Al_xGa_{1-x}As$ layer from x=0.12 to 0.23 30, a 50 nm p$^+$-$Al_{0.25}Ga_{0.75}As$ with Be doping graded from 1 to $8 \times 10^{18}$ to $10^{19}$ cm$^{-3}$ 31, and finally a 200 nm p$^{++}$-GaAs top contact layer with $10^{19}$ cm$^{-3}$ doping 32.

The advantage of using InGaAs as the well material is that the emitted light is not absorbed in any other layers.

Mesa devices with an area of 290×140 μm$^2$ were made using standard GaAs lithography techniques. The top p-type contacts were narrow and ring shaped near the mesa edge resulting in an emission window of 200×100 μm$^2$ for the NIR light from the LED. A 45°-edge facet was polished near the devices to facilitate FIR coupling to the intersubband transition. The device was mounted on a 77K. cold-finger optical cryostat 20, and actual device temperature was estimated to be 820K. A 1000K. blackbody source or a $CO_2$ laser was used as the FIR source. A grating monochromator or a Fourier transform spectrometer were used for wavelength selection. A Si photodiode was used to measure the NIR emission.

The above can be summarized in a preferred embodiment of the invention being comprised of a GaAs/AlGaAs structure for $\lambda_{NIR}$=9 μm. The well is 5.9 nm GaAs and is doped with Si to about $5 \times 10^{11}$ cm$^{-2}$ and the barrier is 40.0 nm undoped $Al_{0.25}Ga_{0.75}As$. The number of wells should be greater than about 20 for high absorption. The larger the number of wells, the lower the detector noise, but practically 20 to 200 wells can be used, with about 50 wells being preferred. The bottom GaAs contact layer should be doped with Si to about $1.5 \times 10^{18}$ cm$^{-3}$, and have a thickness of about 0.8 μm. The substrate for epitaxial growth is preferred to be semi-insulating (100) GaAs.

The LED should be grown after the last barrier of the QWIP. While LED technology is well known, an example of layers suitable for emission at approximately the GaAs bandgap are, in growth sequence, a 40.0 nm graded $Al_xGa_{1-x}As$ layer from x=0.25 to 0.10, a 10 nm GaAs active layer, a 40.0 nm graded $Al_xGa_{1-x}As$ layer from x=0.10 to 0.25, a 500.0 nm p-type-doped $Al_{0.25}Ga_{0.75}As$ with doping of Be at $5 \times 10^{18}$ cm$^{-3}$, and a 100.0 nm p-type-doped GaAs top contact layer with doping of Be at $10^{19}$ cm$^{-3}$.

The CCD can be any of a variety of Si 2 dimensional CCD arrays, for example one made by Dalsa Inc., of Waterloo, Ontario, Canada.

FIGS. 5A–5C illustrate experimental results of the successful laboratory prototype. FIG. 5A shows the LED emitted power at a wavelength of 927 nm, vs bias current. The inset I illustrates the device geometry. A linear relationship of LED output power with bias current may be seen.

Figure 1:
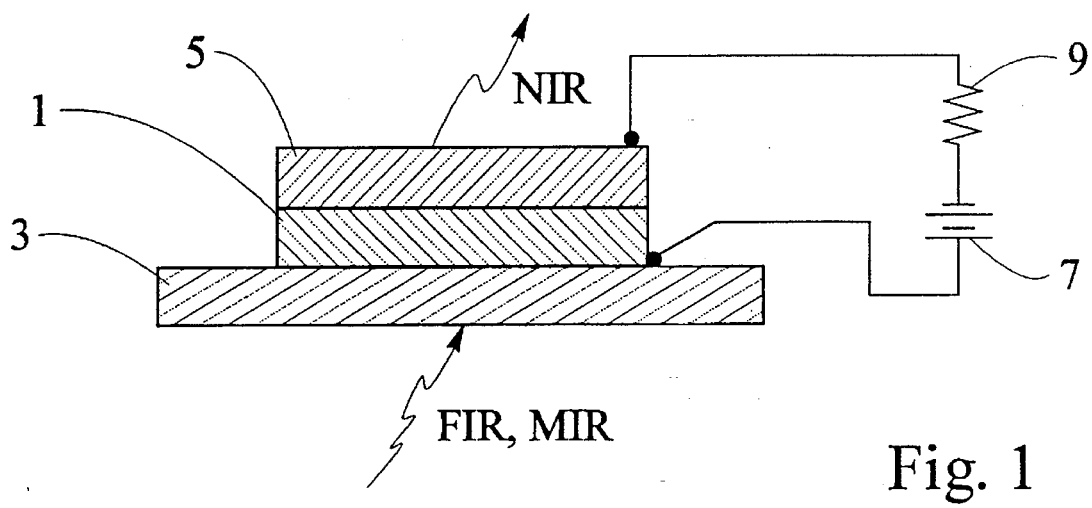
Figure 2:
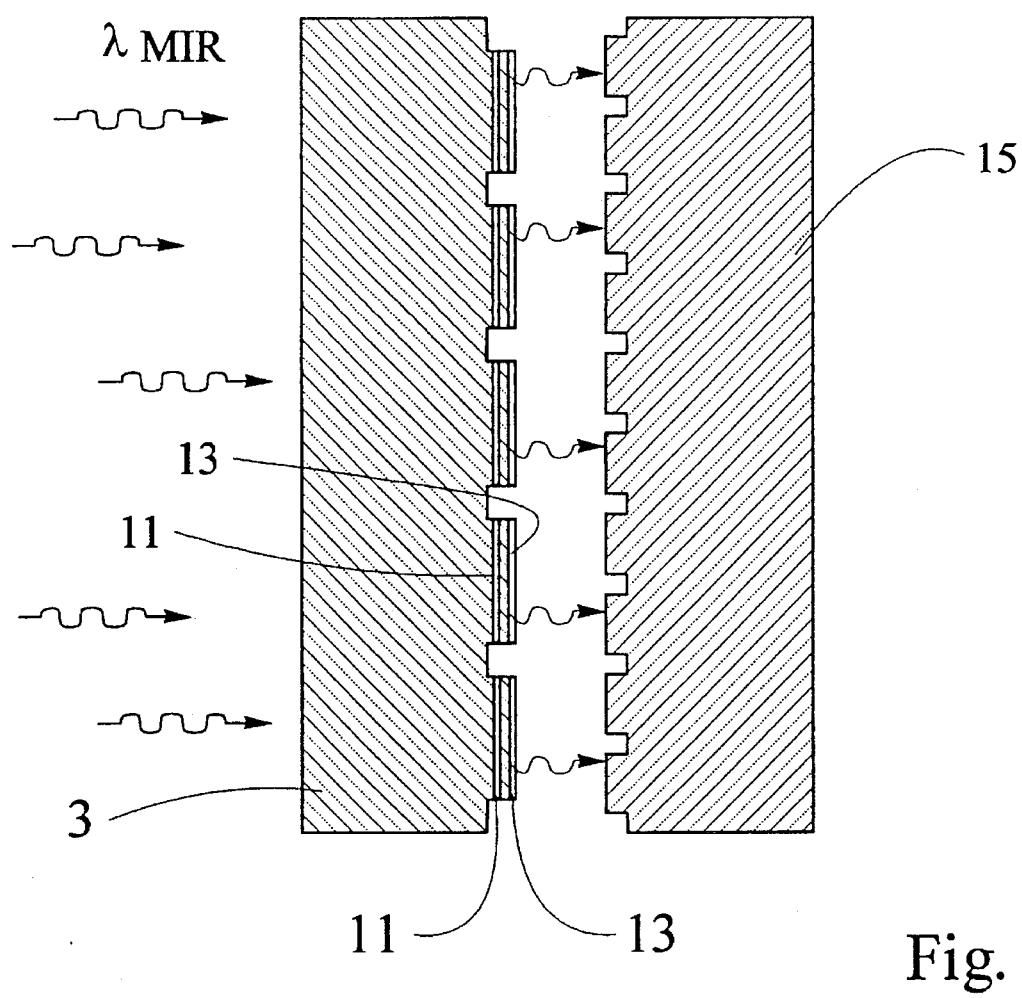
Figure 3:
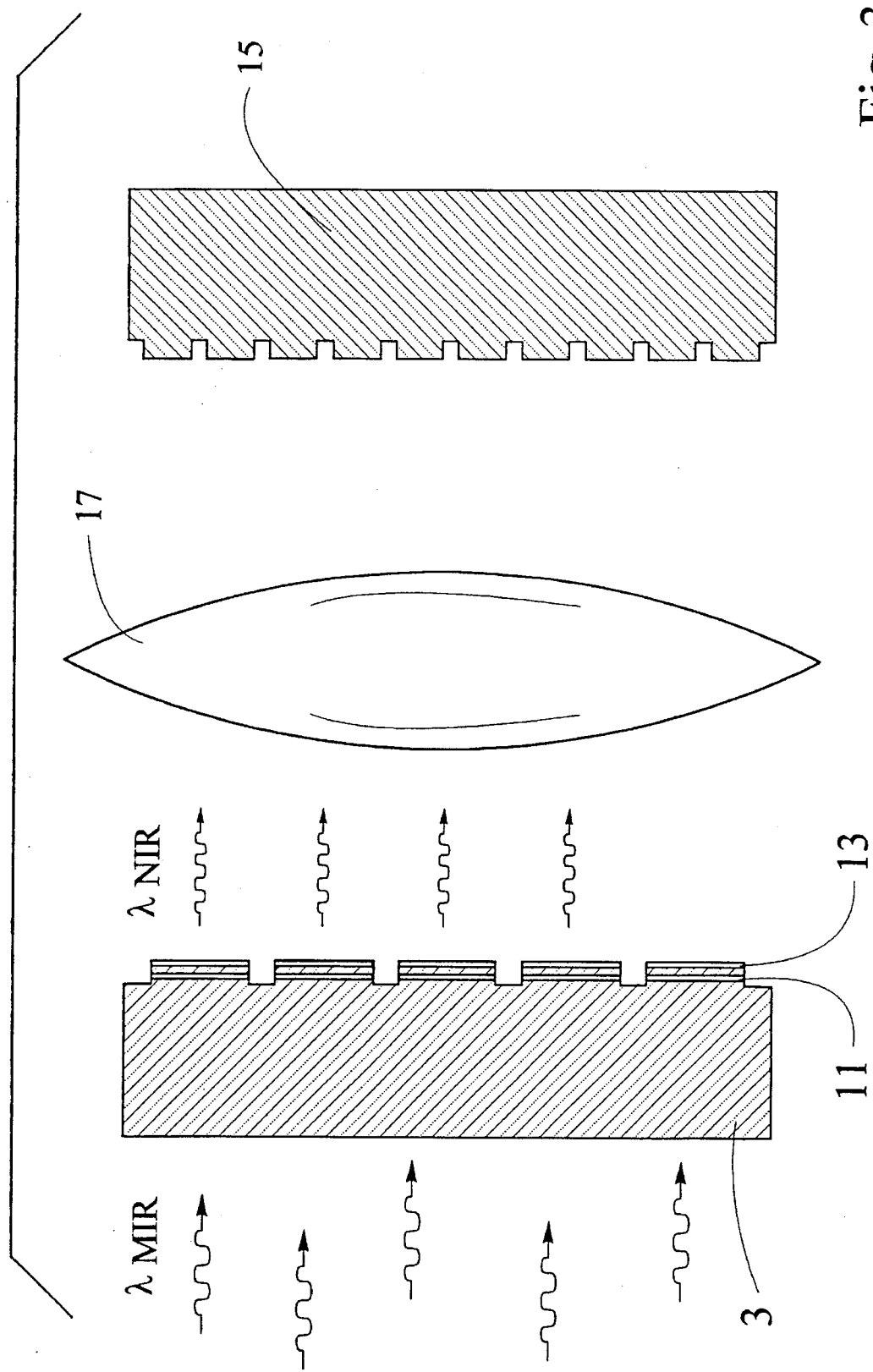
Figure 4:
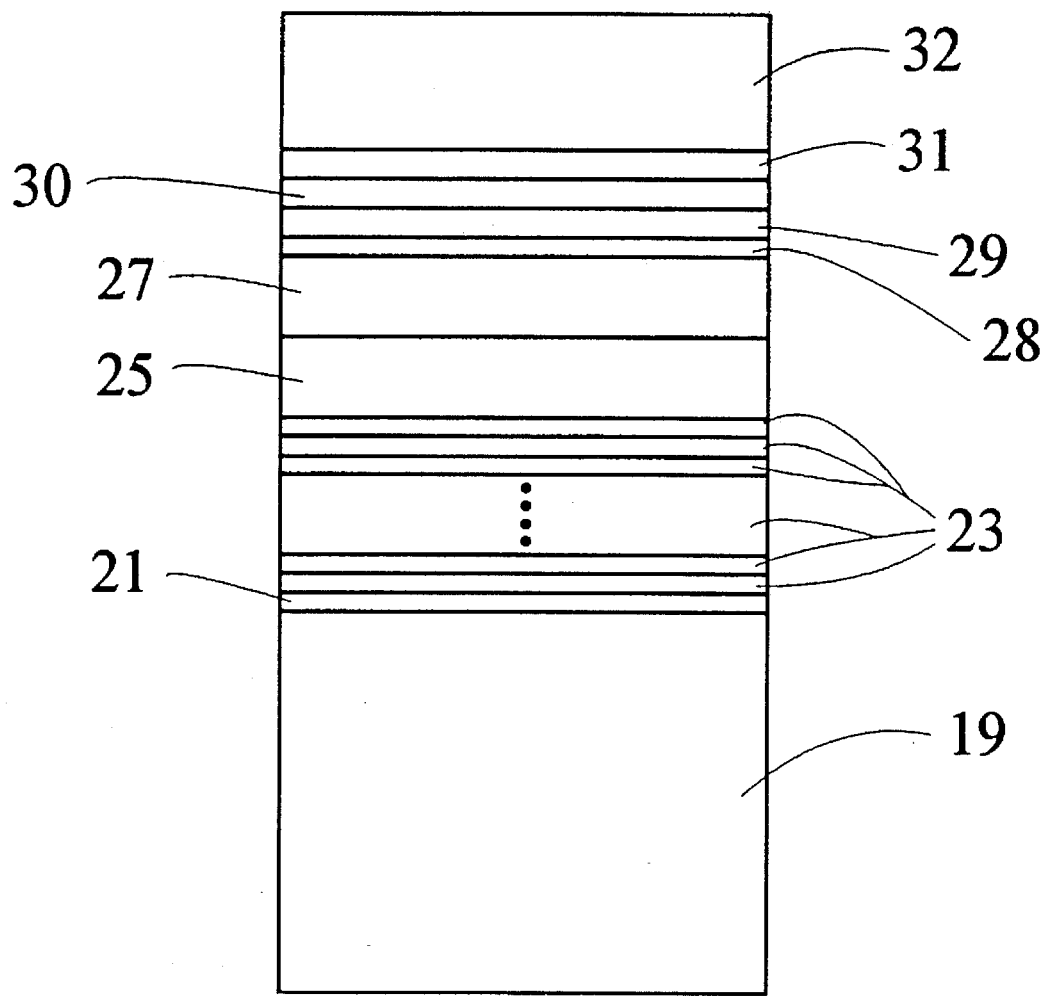
Figure 5A:
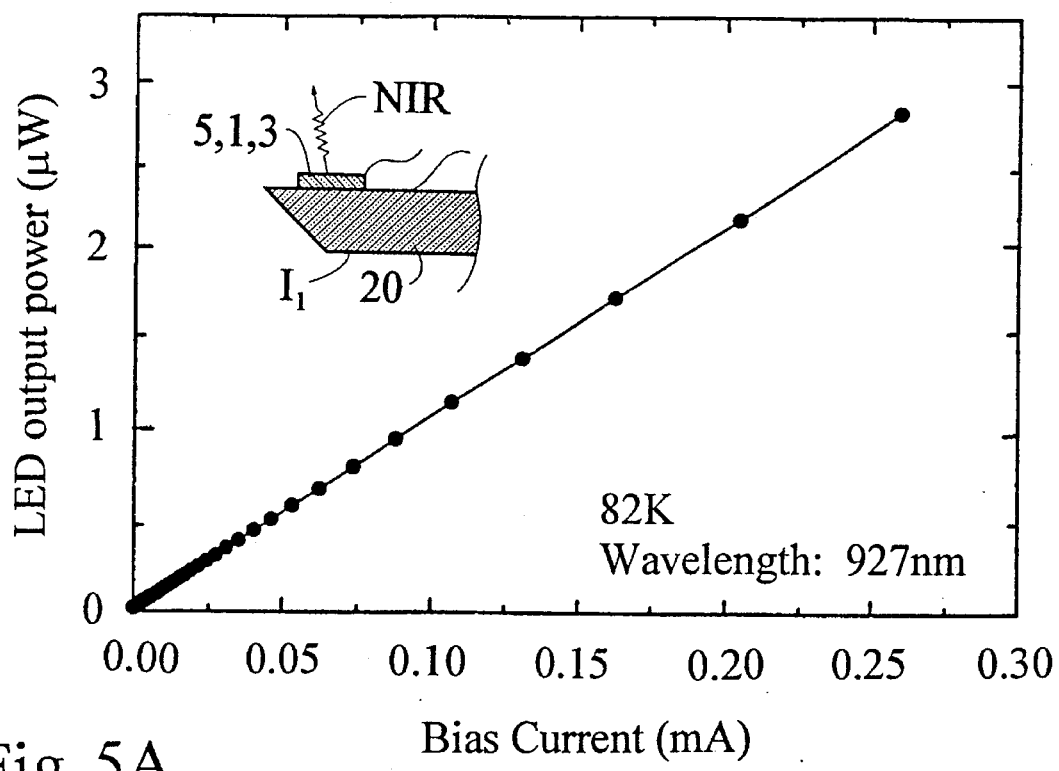
FIG. 5B illustrates the QWIP responsivity for unpolarized light to the illustrated geometry $I_2$ at a wavelength of 9.2 μm. An inset X illustrates normalized spectral response with wavelength.
FIG. 5C illustrates the measured increase of LED emission for several FIR power values to inset $I_3$ at a wavelength of 9.2 μm.
Figure 5B:
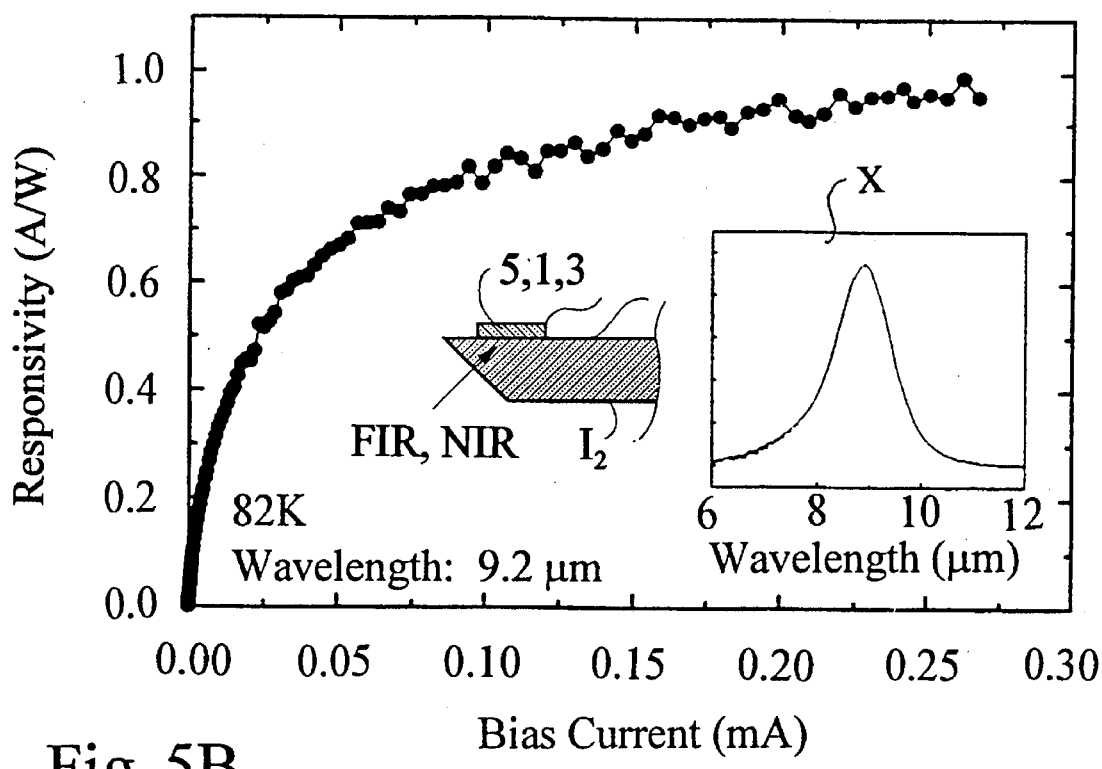

Given the simple LED device structure in the successful laboratory prototype described above, the observed external efficiency is seen to be quite low (from FIG. 5A), by comparing the output photon rate (photons/second) with the input current (electrons/second). Assuming a near unity internal efficiency, which is realistic for high quality InGaAs/GaAs quantum wells, two main factors can lead to the low external efficiency. Firstly, a wide top ring contact metal blocks part of the emission. The ratio of the emitting area and the diode area is about 0.49 for the illustrated graph. Second, a high material refractive index leads to a small escape cone angle, which ideally gives a fraction of escaped light of about 2%. Combining these factors, the expected external efficiency is in agreement with the experimental result.

In order to improve the LED external efficiency, the emitted light can be trapped in a thin layer. Indeed, an impressive 72% efficiency was demonstrated using this technique.

Figure 5C:
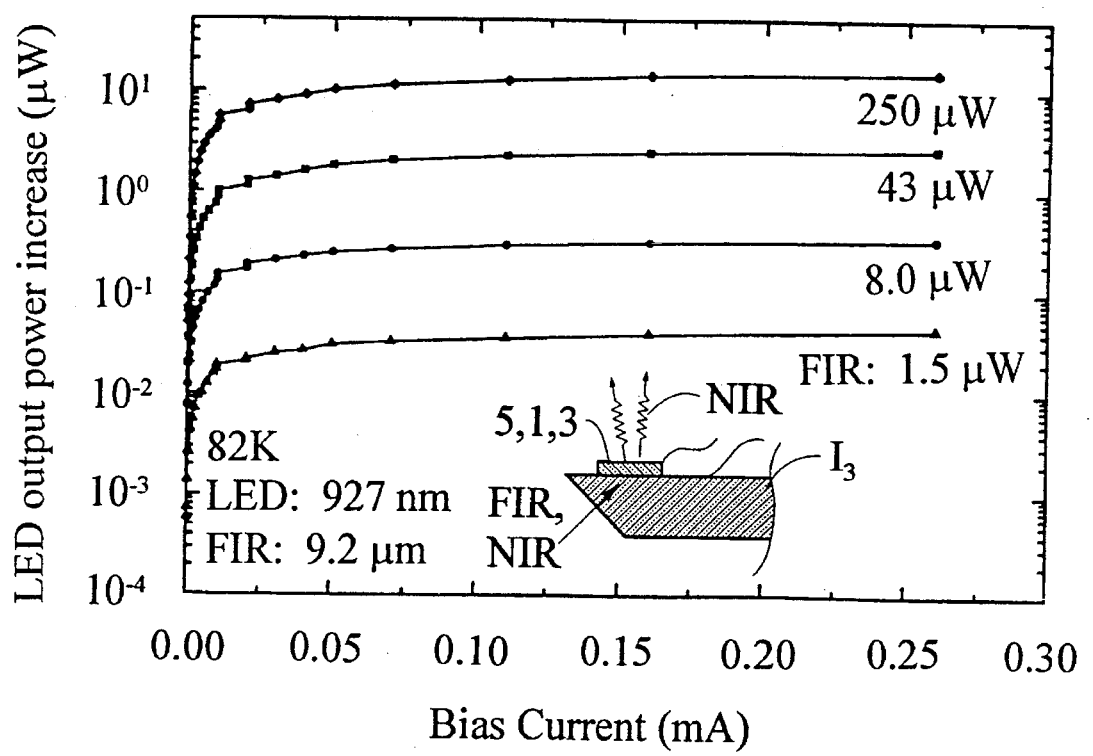

However, even with low LED external efficiency, the increase of emission of the LED could be easily observed for a FIR illumination power of as little as 1.5 μW as shown in FIG. 5C. This shows the relative ease of detecting NIR light as compared with FIR light.

The above demonstrates an mid or far-infrared to near infrared converter using GaAs/AlGaAs quantum well intersubband photodetector integrated with an InGaAs/GaAs quantum well LED. This structure can be scaled up into large efficient and inexpensive two-dimensional arrays suitable for thermal imaging application.

A person understanding this invention may now conceive of alternative structures and embodiments or variations of the above. All of those which fall within the scope of the claims appended hereto are considered to be part of the present invention.

I claim:

1. A far infrared (FIR) to near infrared (NIR) light converter comprising a quantum well intersubband photodetector (QWIP) integrated vertically with a light emitting diode (LED) on a substrate, the substrate being sufficiently transparent so as to allow FIR energy to pass therethrough to the QWIP, and means for applying a bias current to the QWIP and LEC for passing the same bias current through the QWIP and LED.

2. A light converter as defined in claim 1 in which the LED is located over the QWIP as a result of epitaxial growth of the LED over the QWIP.

3. A light converter as defined in claim 2 in which the LED is an electromagnetic energy emitter at NIR wavelengths.

4. A light converter as defined in claim 2 in which the QWIP and LED are disposed on a substrate, the QWIP and LED being divided into a parallel array of sub-QWIPs and a parallel array of sub-LEDs supported by said substrate.

5. A light converter as defined in claim 4 further including a charge coupled device (CCD) disposed in front of the sub-LEDs in a position so as to receive energy emitted by the sub-LEDs.

6. A light converter as defined in claim 5 in which the CCD is located in close proximity to the front of the sub-LEDs.

7. A light converter as defined in claim 5 in which the CCD is spaced from the sub-LEDs, and further including a lens disposed between the sub-LEDs and the CCD for focusing energy emitted by the sub-LEDs on the surface of the CCD.

8. A light converter as defined in claim 4 further including a bias circuit connected to the series connection of the array of sub-QWIPs and the array of sub-LEDs, for passing current through each pair of associated sub-QWIPs and sub-LEDs.

9. A light energy converter as defined in claim 4 in which the QWIP and the LED are comprised of $Al_xGa_{1-x}As$ with $0<=x<=1$ and of $In_yGa_{1-y}As$ with $0\leq y\leq 1$, the CCD being comprised of Si.

10. A light converter as defined in claim 1 in which the QWIP and the LED are comprised of $Al_xGa_{1-x}As$ with $0<=x<=1$ and of $In_yGa_{1-y}As$ with $0\leq y\leq 1$.

11. A light energy converter as defined in claim 1 in which the QWIP is comprised of a series of quantum well layers being greater that about 20 in number.

12. A light converter as defined in claim 1 in which the QWIP is comprised of a series of between 20 and 200 quantum well layers.

13. A light converter as defined in claim 1 in which the QWIP is comprised of a series of about 50 quantum well layers.

* * * * *